United States Patent
Zang et al.

(10) Patent No.: US 9,425,129 B1
(45) Date of Patent: Aug. 23, 2016

(54) METHODS FOR FABRICATING CONDUCTIVE VIAS OF CIRCUIT STRUCTURES

(71) Applicant: GLOBALFOUNDRIES Inc., Grand Cayman (KY)

(72) Inventors: Hui Zang, Guilderland, NY (US); Bingwu Liu, Ballston Spa, NY (US); Dingyou Zhang, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/789,160

(22) Filed: Jul. 1, 2015

(51) Int. Cl.
*H01L 21/768* (2006.01)
*H01L 23/48* (2006.01)
*H01L 23/528* (2006.01)
*H01L 29/16* (2006.01)
*H01L 29/161* (2006.01)
*H01L 21/02* (2006.01)

(52) U.S. Cl.
CPC ........ *H01L 23/481* (2013.01); *H01L 21/02524* (2013.01); *H01L 21/02529* (2013.01); *H01L 21/02532* (2013.01); *H01L 21/76834* (2013.01); *H01L 21/76898* (2013.01); *H01L 29/16* (2013.01); *H01L 29/161* (2013.01); *H01L 29/1608* (2013.01)

(58) Field of Classification Search
CPC ................... H01L 21/02524; H01L 21/02529; H01L 21/02532; H01L 21/76834; H01L 21/76898; H01L 23/481; H01L 27/10829; H01L 29/16; H01L 29/161; H01L 29/1608
USPC ............ 438/268, 289, 303, 653, 667; 257/77, 257/298, 301, 402, 532, 621, 748, 751, 774, 257/E21.159, E21.502, E21.551, E21.553, 257/E21.585, E21.597, E23.011, E23.023
See application file for complete search history.

(56) References Cited

U.S. PATENT DOCUMENTS

| | | | |
|---|---|---|---|
| 2012/0258590 A1* | 10/2012 | Chen ................. | H01L 21/76898 438/653 |
| 2013/0113051 A1* | 5/2013 | Cai .................... | H01L 21/26586 257/402 |
| 2013/0147007 A1* | 6/2013 | Booth, Jr. .......... | H01L 27/10829 257/508 |
| 2015/0187966 A1* | 7/2015 | Asthana ............ | H01L 31/02245 438/64 |
| 2015/0235922 A1* | 8/2015 | Chen ..................... | H01L 23/481 257/383 |
| 2015/0235940 A1* | 8/2015 | Chen ..................... | H01L 23/528 257/759 |
| 2016/0118318 A1* | 4/2016 | Yang ..................... | H01L 23/481 257/401 |

* cited by examiner

*Primary Examiner* — Dao H Nguyen
(74) *Attorney, Agent, or Firm* — Heslin Rothenberg Farley and Mesiti PC; Nicholas Mesiti

(57) ABSTRACT

Methods and structures for fabricating conductive vias in circuit structures are provided. Methods may include, for example, providing a substrate that includes a dopant and at least one trench formed in the substrate; providing an undoped semiconductor layer over a surface of the substrate within the trench; and providing a conductive material on top of dielectric layer in the trench, the conductive material forming the conductive via. The undoped semiconductor layer, having no dopant, reduces a parasitic capacitance between the conductive via and the substrate. The undoped semiconductor layer may also prevent migration of dopant from the substrate into the undoped semiconductor layer, further reducing capacitance in the circuit structure.

20 Claims, 3 Drawing Sheets

METHODS FOR FABRICATING CONDUCTIVE VIAS OF CIRCUIT STRUCTURES

FIELD OF THE INVENTION

The present invention generally relates to fabricating circuit structures, and more specifically, to fabricating conductive via structures and through-silicon via structures of circuit structures.

BACKGROUND OF THE INVENTION

Performance and efficiency of a circuit structure may be sensitive to several factors, including capacitance between conductive or semi-conductive circuit structure features, such as conductive vias and semiconductor substrates through which conductive vias are formed. As circuit structure sizes continue to shrink, such "parasitic capacitance" may increasingly degrade the performance of circuit structures, resulting in increased wasteful power consumption and lower speed of circuit.

BRIEF SUMMARY

Various shortcomings of the prior art are overcome, and additional advantages are provided through the provision, in one aspect, of a method which includes facilitating fabricating a conductive via of a circuit structure, the facilitating fabricating including: providing a semiconductor substrate that includes a dopant and at least one trench formed in the semiconductor substrate; providing an undoped semiconductor layer over a surface of the semiconductor substrate within the trench; and providing a conductive material in the trench, the conductive material forming the conductive via, wherein the undoped semiconductor layer inhibits flow of electrical carriers into the undoped semiconductor layer to reduce a capacitance between the conductive via and the semiconductor substrate.

In another aspect, also provided is a structure including a circuit structure that includes: a semiconductor substrate including a dopant and having at least one trench formed in the semiconductor substrate; an undoped semiconductor layer over a surface of the semiconductor substrate within the trench; and a conductive material in the trench, the conductive material forming the conductive via, wherein the undoped semiconductor layer increases the depletion layer width into the undoped semiconductor layer to reduce a capacitance between the conductive material and the semiconductor substrate.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Figure 1:
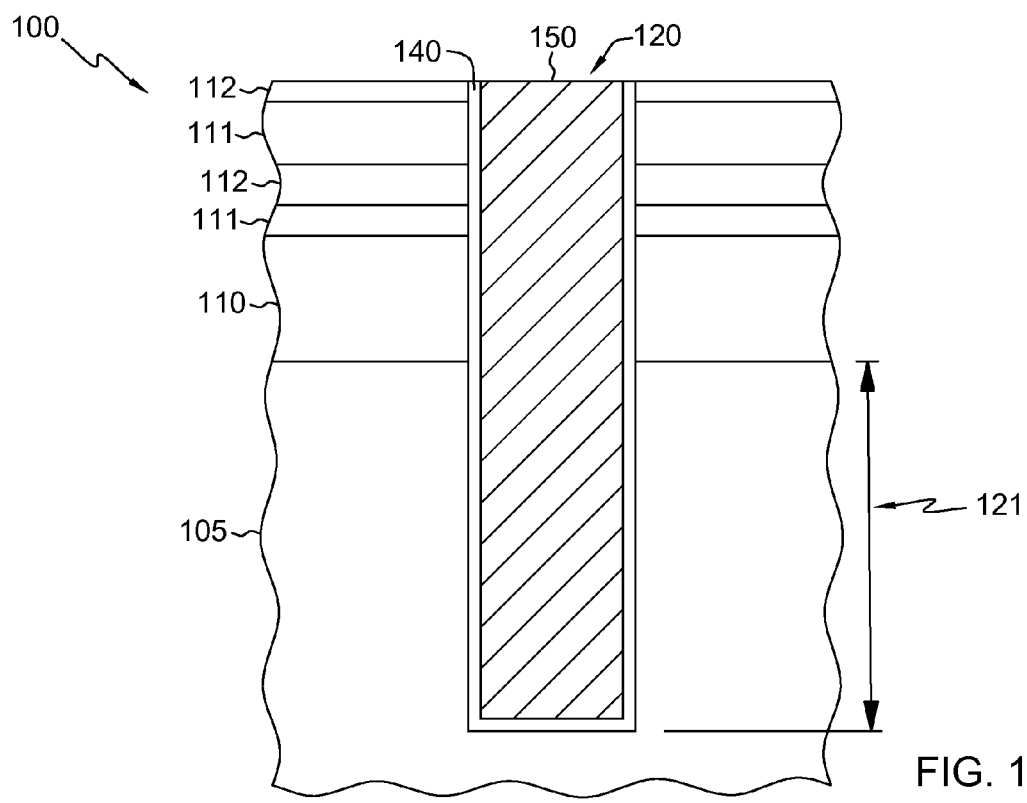
FIG. 1 depicts one embodiment of a conductive via, illustrating issues with circuit structures including conductive vias.

FIG. 1 depicts one embodiment of a structure 100 including a conductive via 150. Conductive via 150 may provide electrical connectivity between layers of a circuit structure that includes structure 100, such as a through-silicon via (TSV) provided to connect multiple circuit structure layers. Conductive via 150 may be formed in a trench 120 formed in or through a semiconductor substrate 105, such as a doped silicon substrate, and may extend through an insulating layer 110, such as a shallow trench isolation (STI) material, and one or more additional circuit structure layers 111, 112. Conductive via 150 may be electrically isolated from semiconductor substrate 105 and additional layers 110, 111, 112 by insulating layer 140, which may include a dielectric material such as silicon oxide ($SiO_2$). Insulating layer 140 may include a plurality of insulating materials, such as a layer of silicon oxide and a layer of tantalum and a copper (Cu) barrier layer and a layer of tantalum nitride (TaN).

A conductive via such as conductive via 150 may produce a relatively high parasitic capacitance within a circuit structure, which may in turn increase signal transmission delay within the circuit structure, increase power consumption, and increase parasitic resistance, leading to an overall decrease in the performance of the circuit structure. A parasitic capacitance produced by conductive via 150 may be relatively high due, at least in part, to the relatively large surface area interface between conductive via 150 and semiconductor substrate 105, due in part to the relatively large depth 121 of the via trench 120 formed in or through substrate 105. For example, via trench 120 may penetrate to a depth 121 of about 55 to 60 μm, or more, into or through semiconductor substrate 105, producing a large surface interface area between the conductive material of conductive via 150 and the doped semiconductor material of substrate 105. A single circuit structure including multiple circuit structure layers may include a large number of through-silicon vias to connect the multiple circuit structure layers, so that parasitic capacitance produced by conductive vias 150 may significantly degrade the power consumption and performance of the circuit structure.

Parasitic capacitance between conductive via 150 and substrate 105 may also be relatively high due to the presence of a dopant in semiconductor substrate 105. Semiconductor substrates of many circuit structures may be doped before or during fabrication of transistors and other circuit structure features. For example, many substrates of circuit structures may be doped with a p-type dopant, such as boron, or may be doped with an n-type dopant, such as phosphorous. Capacitance may partially depend on a concentration of dopant at a surface of semiconductor substrate 105 because the capacitor works in depletion mode; an increase in dopant concentration may correspond with an increase in capacitance between semiconductor substrate 105 and conductive via 150. Accordingly, a decrease in dopant concentration at a surface of substrate 105 may decrease parasitic capacitance between semiconductor substrate 105 and conductive via 150.

Figure 2A:
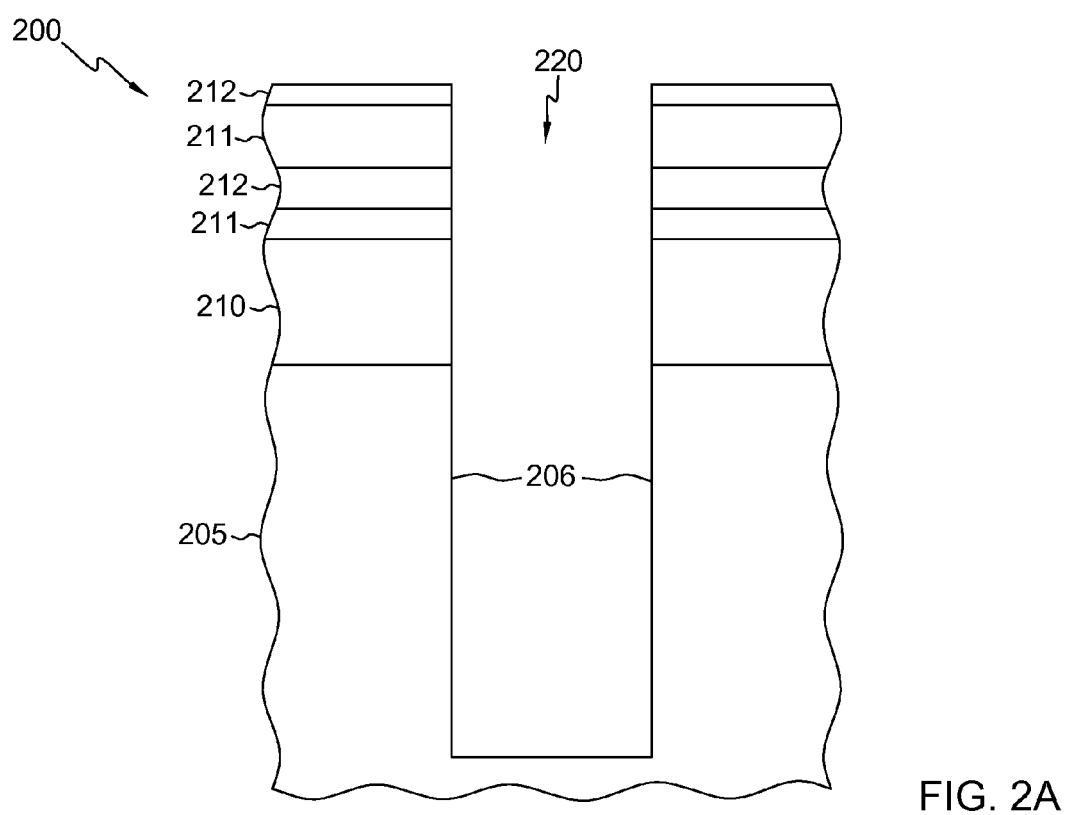
FIGS. 2A-2E depict one embodiment of a process for facilitating fabrication of a conductive via with reduced parasitic capacitance, in accordance with one or more aspects of the present invention.

FIGS. 2A-2E depict one embodiment of a process for facilitating fabricating a conductive via of a circuit structure that may reduce parasitic capacitance produced by the conductive via of the circuit structure. FIG. 2A depicts a structure 200 including a semiconductor substrate 205 and a trench 220 formed in semiconductor substrate 205. Trench 220 may be, for example, a through-silicon via (TSV) trench. In some examples, a TSV trench 220 may be formed completely through semiconductor substrate 205 to permit connection between multiple circuit structure layers (not depicted in FIG. 2A) through the TSV connection. Trench 220 may be formed by any process for forming a trench or via in a substrate. Trench 220 may also be formed through an insulating layer 210, such as a shallow trench isolation (STI) material layer, as well as additional layers 211, 212 of a circuit structure including structure 200. Formation of trench 220 may result in formation of a surface 206 of semiconductor substrate 205 within trench 220. In exemplary embodiments semiconductor substrate 205 may include a dopant, such as a p-type dopant or an n-type dopant. For example, a p-type doped semiconductor substrate 205 may include boron as the p-type dopant, although other p-type dopants such as aluminum and gallium may also be included. For an n-type doped semiconductor substrate, by way of example, the dopant may be phosphorous.

Figure 2B:
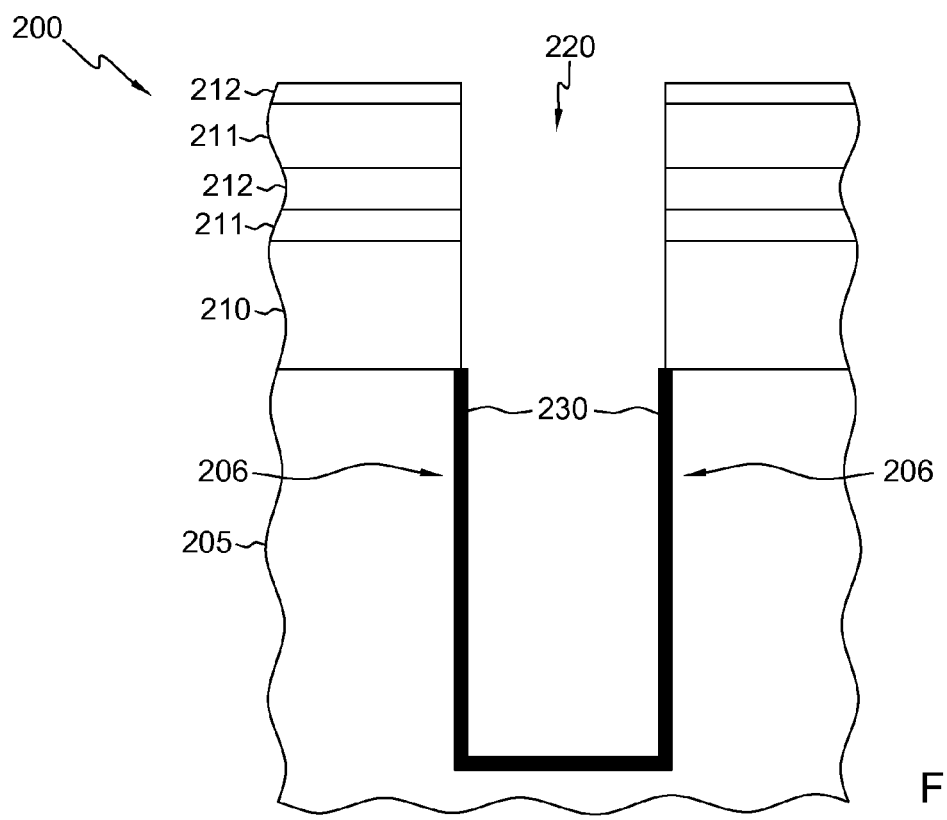

FIG. 2B depicts the structure 200 of FIG. 2A following provision of an undoped semiconductor layer 230 over a surface 206 of semiconductor substrate 205 within trench 220. Undoped semiconductor layer 230 may, as described further below, reduce capacitance between semiconductor substrate 205 and a conductive via formed in trench 220, due to the lack of charge carriers (i.e., dopant atoms) within the undoped semiconductor layer. The undoped semiconductor layer, having no dopant material, may also inhibit the flow of electrical carriers into the undoped semiconductor, thus reducing capacitance between the semiconductor substrate 205 and a conductive via 250 to be formed in trench 220.

Providing undoped semiconductor layer 230 may, in exemplary embodiments, include epitaxially growing the undoped semiconductor layer 230 over surface 206 of semiconductor substrate 205 within trench 220. Epitaxial growth of undoped semiconductor layer 230 may advantageously allow for formation of the undoped semiconductor layer 230 at a low temperature that may inhibit or prevent migration of dopant from semiconductor substrate 205 into the undoped semiconductor layer 230 material. For example, the epitaxial growth of an undoped semiconductor layer 230 may be performed at temperatures of about 500° C. or less. As well, an epitaxial growth process may advantageously permit formation of undoped semiconductor layer 230 over surface 206 of the semiconductor substrate 205 without also forming a layer of the undoped semiconductor material over circuit structure layers 210, 211, 212. Undoped semiconductor layer 230 may be formed to any appropriate thickness. In ideal embodiments, a thickness of undoped semiconductor layer 230 may be about 5 nm up to about 30 nm. An undoped semiconductor layer 230 less than about 5 nm may not sufficiently reduce capacitance, while an undoped semiconductor layer 230 greater than about 30 nm may not maintain a desired crystalline lattice structure within the undoped semiconductor layer 230 and may undesirably deform.

Undoped semiconductor layer 230 may include any undoped semiconductor material, such as undoped or "intrinsic" silicon. Undoped semiconductor layer 230 may, in other examples, include a semiconductor material selected to facilitate preventing migration of dopant from semiconductor substrate 205 into or through the undoped semiconductor layer 230 during formation of a conductive via in trench 220 and during use or operation of a circuit structure. For example, undoped semiconductor layer 230 may include silicon-germanium. In another example, undoped semiconductor layer 230 may include silicon-carbide. Either or both silicon-germanium and silicon-carbide may be ideal undoped semiconductor layers 230 to be used in conjunction with a semiconductor substrate 205 doped with, for example, a p-type dopant such as boron. Silicon-germanium or silicon-carbide may be highly resistant to boron migration, as well as other p-type dopant migration, at high temperatures or during operation of a circuit structure, and thus may not only reduce parasitic capacitance between semiconductor substrate 205 and a conductive via 250 but may also prevent increases in parasitic capacitance over time by blocking migration of dopant into or through the interface area between undoped semiconductor layer 230 and conductive via 250.

Figure 2C:
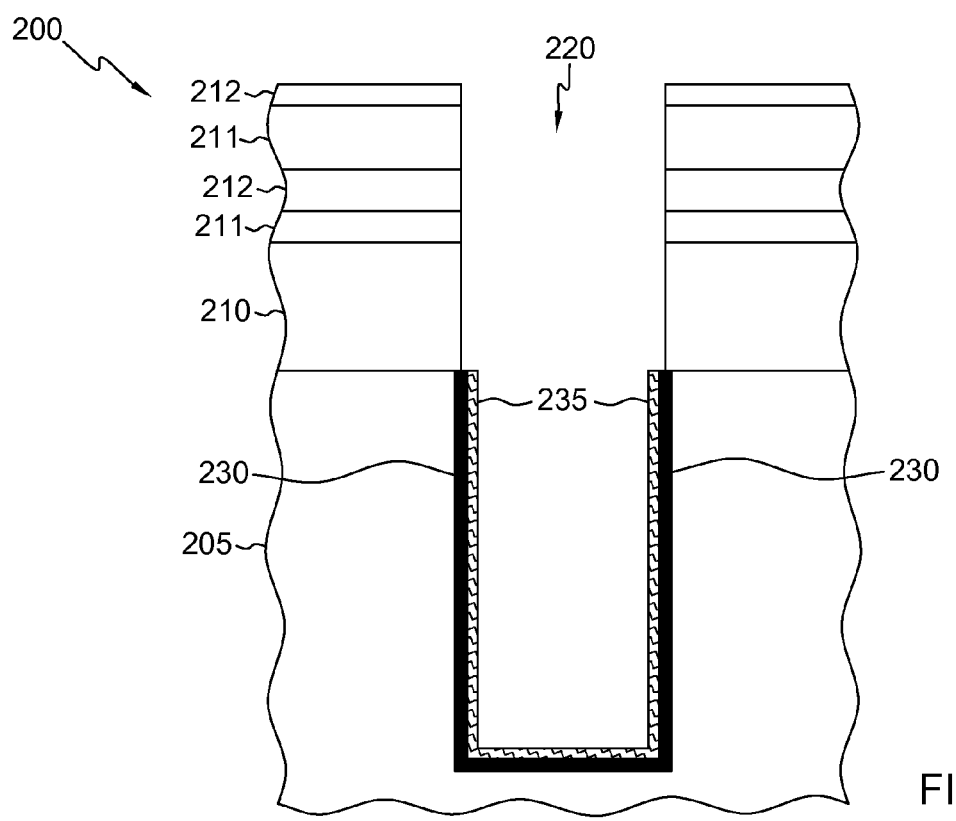

FIG. 2C depicts one embodiment of structure 200 from FIG. 2B in which undoped semiconductor layer 230 is a first undoped semiconductor layer 230, and with a second undoped semiconductor layer 235 provided over the first undoped semiconductor layer 230. In exemplary embodiments, the second undoped semiconductor layer 235 may include undoped or "intrinsic" silicon. Second undoped semiconductor layer 235 may be provided, for example, by an epitaxial growth process. Adding second undoped semiconductor layer 235 may not be necessary in all embodiments of the processes and structures disclosed herein, although a second undoped semiconductor layer 235 may further reduce a capacitance between semiconductor substrate 205 and a conductive via formed in conductive via trench 220. In exemplary embodiments, a combined thickness of first and second undoped semiconductor layers 230, 235 may be between about 5 nm and about 30 nm.

Figure 2D:
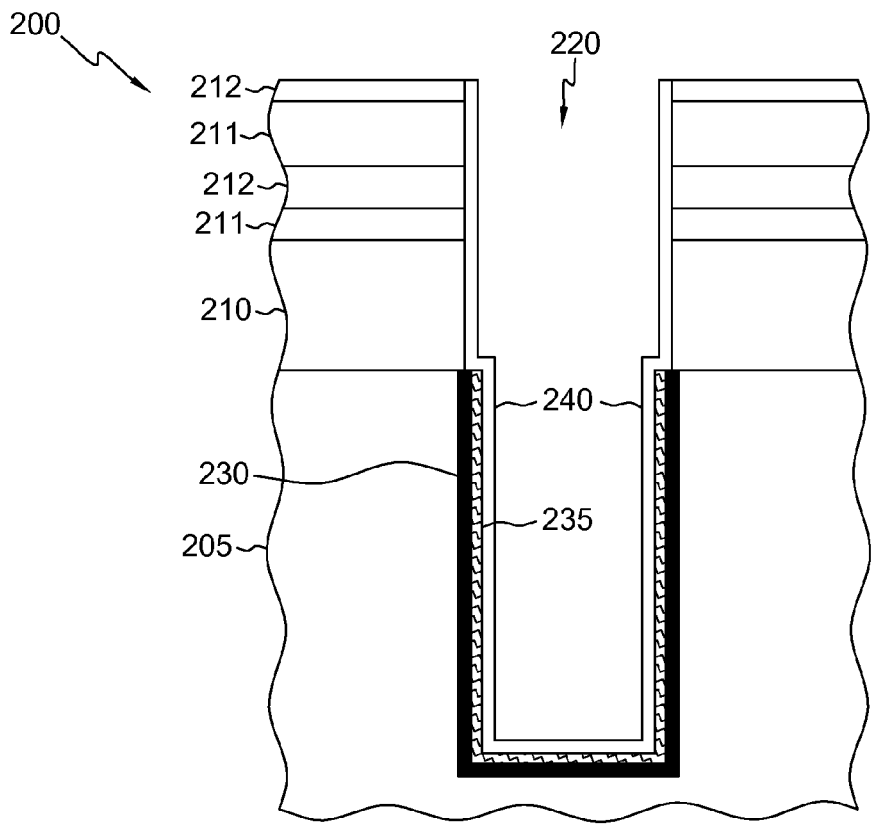

FIG. 2D depicts structure 200 of FIG. 2C with one or more dielectric layers 240 provided over undoped semiconductor layer 230. In the exemplary embodiment depicted, one or more dielectric layers 240 are provided over first undoped semiconductor layer 230 and second undoped semiconductor layer 235, although it may be understood that in embodiments in which second undoped semiconductor layer 235 is not provided or included, the one or more dielectric layers 240 may simply be provided over undoped semiconductor layer 230. One or more dielectric layers 240 may include, for example, a layer of silicon oxide ($SiO_2$), a layer of tantalum and/or a layer of tantalum nitride (TaN), or another layer of dielectric material.

Figure 2E:
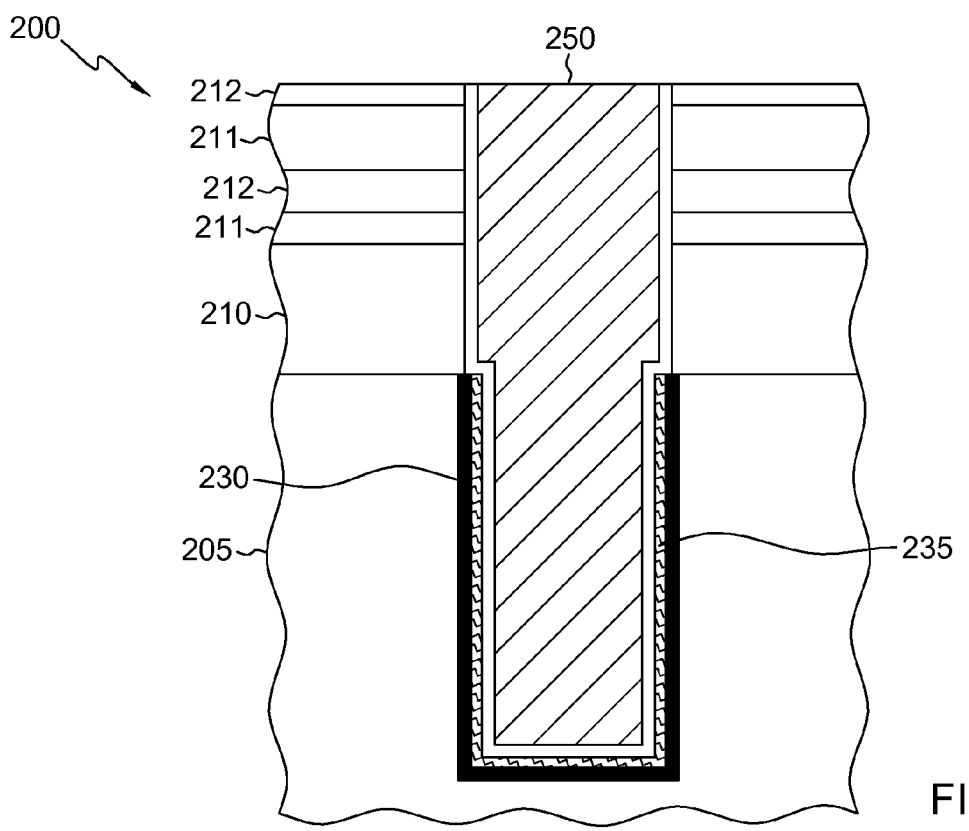

FIG. 2E depicts structure 200 of FIG. 2D with a conductive material provided in trench 220, so that the conductive material forms conductive via 250. Conductive via 250 may, in ideal embodiments, include copper, or may include any other appropriate conductive material for forming a conductive via. Undoped semiconductor layer 230 of structure 200 reduces a capacitance between conductive via 250 and substrate 205 due to undoped semiconductor layer 230 including little or no dopant material, and inhibiting flow of electrical carriers into the undoped semiconductor layer 230. Undoped semiconductor layer 230 may also act to prevent migration of dopant from semiconductor substrate 205 into undoped semiconductor layer 230, further reducing parasitic capacitance between semiconductor substrate 205 and conductive via 250. In the exemplary embodiment illustrated, first undoped semiconductor layer 230 and second undoped semiconductor layer 235 may reduce capacitance between conductive via 250 and semiconductor substrate 205.

In the example illustrated by FIG. 2E, first undoped semiconductor layer 230 may also act to prevent migration of dopant from substrate 205 into first undoped semiconductor layer 230 and second undoped semiconductor layer 235. For example, first undoped semiconductor layer 230 may include silicon-germanium and second undoped semiconductor layer 235 may include intrinsic silicon. Intrinsic silicon may be resistant to dopant migration, such as migration of boron dopant atoms, at relatively low temperatures, such as below about 500° C. However, silicon-germanium may resist boron migration at much higher temperatures, such as temperatures of 800° to 900° C. In some exemplary embodiments, such as in a middle-of-line circuit structure fabrication process, structure 200 may be subjected to such higher temperatures in subsequent processing steps, so that a first undoped layer of silicon-germanium may protect the second undoped layer of intrinsic silicon during subsequent processing. In alternative embodiments, the formation of conductive via 250 may be one of the last processing steps in a back-end-of-line process, so that a single layer of undoped intrinsic silicon 230 may not be subjected to high-temperatures and a layer of undoped silicon-germanium or silicon-carbide may not be necessary.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    facilitating fabricating a conductive via of a circuit structure, the facilitating fabricating comprising:
        providing a semiconductor substrate comprising a dopant and at least one trench formed in the substrate;
        providing an undoped semiconductor layer over a surface of the semiconductor substrate within the trench; and
        providing a conductive material in the trench, the conductive via comprising the conductive material, wherein the undoped semiconductor layer inhibits flow of electrical carriers into the undoped semiconductor layer to thereby reduce a capacitance between the conductive via and the substrate.

2. The method of claim 1 wherein the trench is a through-silicon via trench, and wherein the conductive via comprises a through-silicon via.

3. The method of claim 1, wherein providing the undoped semiconductor layer comprises epitaxially growing the undoped semiconductor layer over the surface of the substrate within the trench.

4. The method of claim 3, wherein the undoped semiconductor layer comprises undoped silicon.

5. The method of claim 3, wherein the undoped semiconductor layer comprises a material selected to facilitate preventing migration of the dopant from the substrate into or through the undoped semiconductor layer.

6. The method of claim 5, wherein the undoped semiconductor layer comprises silicon-germanium.

7. The method of claim 5, wherein the undoped semiconductor layer comprises silicon-carbide.

8. The method of claim 5, wherein the undoped semiconductor layer comprises silicon-germanium-carbide.

9. The method of claim 5, wherein the undoped semiconductor layer is a first undoped semiconductor layer, the method further comprising providing a second undoped semiconductor layer over the first undoped semiconductor layer.

10. The method of claim 9, wherein the second undoped semiconductor layer comprises undoped silicon.

11. The method of claim 3, wherein the epitaxially growing comprises epitaxially growing the undoped semiconductor layer at a temperature of about 500° C. or less.

12. The method of claim 1, further comprising providing one or more dielectric layers over the undoped semiconductor layer prior to providing the conductive material in the trench.

13. A structure comprising:
    a circuit structure, the circuit structure comprising:
        a semiconductor substrate comprising a dopant and at least one trench formed in the substrate;
        an undoped semiconductor layer over a surface of the substrate within the trench; and
        a conductive material in the trench, wherein the undoped semiconductor layer increases the depletion layer width of the undoped semiconductor layer to thereby reduce a capacitance between the conductive material and the semiconductor substrate.

14. The structure of claim 13, wherein the undoped semiconductor layer comprises undoped silicon.

15. The structure of claim 13, wherein the undoped semiconductor layer comprises a material selected to facilitate preventing migration of the dopant from the semiconductor substrate into or through the undoped semiconductor layer.

16. The structure of claim 15, wherein the undoped semiconductor layer comprises silicon-germanium.

17. The structure of claim 15, wherein the undoped semiconductor layer comprises silicon-carbide.

18. The structure of claim 15, wherein the undoped semiconductor layer comprises silicon-germanium-carbide.

19. The structure of claim 18, wherein the second undoped semiconductor layer comprises undoped silicon.

20. The structure of claim 15, wherein the undoped semiconductor layer is a first undoped semiconductor layer, and the structure further comprises a second undoped semiconductor layer over the first undoped semiconductor layer.

\* \* \* \* \*